US 11,345,992 B2

(12) United States Patent
    Saitou et al.

(10) Patent No.: US 11,345,992 B2
(45) Date of Patent: May 31, 2022

(54) VACUUM DEPOSITION APPARATUS

(71) Applicant: ULVAC, INC., Kanagawa (JP)

(72) Inventors: Shuuji Saitou, Kanagawa (JP); Akihiro Yokoyama, Kanagawa (JP)

(73) Assignee: ULVAC, INC., Kanagawa (JP)

( * ) Notice: Subject to any disclaimer, the term of this patent is extended or adjusted under 35 U.S.C. 154(b) by 0 days.

(21) Appl. No.: 17/156,985

(22) Filed: Jan. 25, 2021

(65) Prior Publication Data

US 2021/0140034 A1    May 13, 2021

Related U.S. Application Data

(63) Continuation-in-part of application No. PCT/JP2019/042105, filed on Oct. 28, 2019.

(30) Foreign Application Priority Data

Mar. 12, 2019 (JP) .............................. JP2019-044883

(51) Int. Cl.
    *C23C 14/24*    (2006.01)
    *C23C 14/50*    (2006.01)
    *C23C 14/56*    (2006.01)

(52) U.S. Cl.
    CPC .......... *C23C 14/562* (2013.01); *C23C 14/243* (2013.01); *C23C 14/505* (2013.01); *C23C 14/564* (2013.01)

(58) Field of Classification Search
    CPC ... C23C 14/562; C23C 16/545; C23C 14/243; C23C 14/505; C23C 14/564

(Continued)

(56) References Cited

U.S. PATENT DOCUMENTS 5,328,737 A  *  7/1994  Takahashi ............... C23C 16/26
                                                          427/128
7,754,015 B2     7/2010  Sasaki et al.
                (Continued)

FOREIGN PATENT DOCUMENTS

JP    2010-163693 A    7/2010
JP    2014-077193 A    5/2014
                (Continued)

OTHER PUBLICATIONS

International Search Report for PCT Patent App. No. PCT/JP2019/042105 (dated Jan. 28, 2020).

(Continued)

*Primary Examiner* — Aiden Lee
(74) *Attorney, Agent, or Firm* — Cermak Nakajima & McGowan LLP; Tomoko Nakajima

(57) ABSTRACT

Inside a main chamber there are provided: first partition walls partitioning a deposition chamber having a deposition unit; and second partition walls disposed in continuation to the first partition walls so as to cover outer cylinder parts of a can-roller while leaving a first gap that curves at a curvature coinciding with an outer peripheral surface of the can-roller. The deposition chamber and an adjacent chamber are in communication with each other with the first gap such that a conductance between the deposition chamber and the adjacent chamber is determined by the second partition walls. At least one of the second partition walls is arranged to be rotatable, with a rotary shaft of the can-roller, between a shielding position which shields such a part of the can-roller as is lying opposite to the deposition unit, and a withdrawn position which is circumferentially away from the deposition unit.

4 Claims, 7 Drawing Sheets

(58) Field of Classification Search
USPC .......................................... 118/718, 726–727
See application file for complete search history.

(56) References Cited

U.S. PATENT DOCUMENTS

| | | | |
|---|---|---|---|
| 2006/0159844 A1* | 7/2006 | Moriwaki | G11B 5/851 427/127 |
| 2008/0102222 A1* | 5/2008 | Fujinawa | H01J 37/3277 427/569 |
| 2010/0075036 A1* | 3/2010 | Okazaki | H01M 4/1395 118/718 |
| 2012/0240854 A1* | 9/2012 | Hayakawa | B05D 1/60 118/719 |
| 2014/0212600 A1* | 7/2014 | Neil | H01J 37/32761 427/569 |
| 2016/0071699 A1 | 3/2016 | Segawa et al. | |
| 2016/0273096 A1* | 9/2016 | Kurapov | C23C 14/50 |

FOREIGN PATENT DOCUMENTS

| | | |
|---|---|---|
| JP | 2014-234523 A | 12/2014 |
| JP | 2016-191126 A | 11/2016 |
| JP | 2019-502025 A | 1/2019 |
| WO | WO2004/059032 A1 | 7/2004 |

OTHER PUBLICATIONS

Notice of Allowance for Japanese Patent App. No 2020-506372 (dated Mar. 3, 2020) with English language translation.

English language International Preliminary Report On Patentability for PCT Patent App. No. PCT/JP2019/042105 (dated Sep. 23, 2021).

* cited by examiner

Z-AXIS DIRECTION

Y-AXIS DIRECTION

VACUUM DEPOSITION APPARATUS

This application is a Continuation-in-Part under 35 U.S.C. § 120 of, and claims priority to, PCT Patent Application No. PCT/JP2019/042105, filed on Oct. 28, 2019, which claims priority under 35 U.S.C. § 119 to Japanese Patent Application No. 2019-044883, filed Mar. 12, 2019, both of which are incorporated by reference.

TECHNICAL FIELD

The present invention relates to a vacuum deposition apparatus comprising: a main chamber having a base material transportation means for transporting a sheet-like base material and a can-roller around which is wound the sheet-like base material to be transported by the base material transportation means, the main chamber being capable of forming therein a vacuum atmosphere; and a deposition unit for depositing on such a part of the sheet-like base material as is wound around the can-roller.

BACKGROUND ART

This kind of vacuum deposition apparatus is known, e.g., in patent document 1. In this known apparatus, inside a vacuum chamber (main chamber) that is capable of forming a vacuum atmosphere therein: a sheet-like base material is continuously fed out of a feed roller of a base material transportation means; while winding this fed out base material around a cooling-purpose can-roller, deposition material is deposited toward this can-roller from a deposition unit disposed at a predetermined distance in the radia direction relative to the can-roller; and then the deposited sheet-like base material is arranged to be taken up by a take-up roller of the base material transportation means. In this case, the vacuum chamber is partitioned into two chambers by a partition plate disposed about the can-roller, and one of the chambers (deposition chamber) has disposed therein a base material transportation means and the other of the chambers (adjacent chamber) has disposed therein a deposition unit, respectively. As the deposition unit there is utilized one which is provided with: a crucible that is fixedly disposed inside the vacuum chamber so as to contain therein the deposition material; and a heating means of resistance heating type, induction heating type, electron-beam type and the like for heating the deposition material contained in the crucible. The deposition material contained in the crucible is thus caused to be sublimated or evaporated by heating, and the sublimated or evaporated deposition particles are made to get adhered and accumulated for deposition (film formation) on such a part of the sheet-like base material as is wound around the can-roller.

Further, a so-called line source is generally known (see, e.g., patent document 2) as a deposition unit for depositing on an object to be deposited such as a sheet-like base material with a relatively large width or a substrate, the object to be deposited being arranged to move (be transported) at a given speed. The line source in question is provided with: a container box for containing therein a deposition material; and a heating means for heating the deposition material inside the container box. A lid body (upper surface) of the container box is provided with tubular discharge openings arranged side by side at a distance from one another in a widthwise direction of the base material. In this kind of deposition unit, when the deposition particles that have been sublimated or evaporated as a result of heating by the container box are discharged out of each of the discharge openings, they will be splashed from the discharge openings toward the object to be deposited while expanding in a dome shape according to a given cosine law. However, since the diameter of each of the discharge openings is small, there is a limit to an attempt to increase the film-forming rate. As a solution, it is considered to provide the lid body of the container box with large-area discharge openings (considerably far larger than the sum of the opening diameters of each of the discharge openings) so as to discharge from the discharge openings the sublimated or evaporated deposition particles, thereby increasing the film-forming rate.

However, if the deposition unit having this kind of discharge openings of larger area are simply applied to the above-mentioned known vacuum deposition apparatus, the particles discharged out of the discharge openings of the evaporation unit will be spread and diffused inside the deposition chamber. As a consequence, not only will the deposition chamber be contaminated, but also will the efficiency of deposition on the base material wound around the can-roller be lowered. In addition, the discharged particles will leak through the clearance between the partition plate and the cooling-purpose can-roller so as to wrap around to an adjacent chamber, thereby contaminating also the adjacent chamber. In this case, the degree of closing between the deposition chamber and the adjacent chamber (i.e., a conductance value that is the resistance component of connection between the deposition chamber and the adjacent chamber) will be secured by the clearance between the partition plate and the can-roller and/or the clearance between the can-roller and the inner wall surface of the vacuum chamber. However, since the clearance between the partition plate and the can-roller is also a space for the sheet-like base material to pass therethrough as a result of rotation of the can-roller, it is necessary to secure above a certain amount of clearance. However, in the above-mentioned arrangement, it is difficult to increase the degree of closure between the deposition chamber and the adjacent chamber (in other words, it is difficult to separate the atmosphere between the deposition chamber and the adjacent chamber so as to prevent the particles leaked from the deposition chamber from wrapping around to the adjacent chamber).

PRIOR ART DOCUMENTS

Patent Documents

Patent Document 1: JP-A-2010-163693
Patent Document 2: JP-A-2014-77193

SUMMARY OF THE INVENTION

Problems that the Invention is to Solve

In view of the above-mentioned points, this invention has a problem of providing a vacuum deposition apparatus in which, at the time of deposition on such a part of the sheet-like base material as is wound around a can-roller, a deposition chamber and an adjacent chamber can surely be separated in terms of atmosphere.

Means for Solving the Problems

In order to solve the above-mentioned problems, a vacuum deposition apparatus comprises: a main chamber having a base material transportation means for transporting a sheet-like base material and a can-roller around which is wound the sheet-like base material to be transported by the base material transportation means, the main chamber being capable of forming therein a vacuum atmosphere; and a deposition unit for depositing on such a part of the sheet-like base material as is wound around the can-roller. The main chamber further comprises therein first partition walls partitioning a deposition chamber which stores therein the deposition unit, and second partition walls disposed in continuation to the first partition walls so as to cover such outer cylinder parts of the can-roller as are positioned on both circumferential sides of the deposition unit while leaving a first gap that curves at a curvature coinciding with an outer peripheral surface of the can-roller. The deposition chamber and such an adjacent chamber as is adjacent to the deposition chamber and as is inside the main chamber are in communication with each other with the first gap serving as a boundary such that a conductance between the deposition chamber and the adjacent chamber is determined by the second partition walls, wherein at least one of the second partition walls is arranged to be rotatable, with a rotary shaft of the can-roller serving as a center of rotation, between a shielding position which shields such a part of the can-roller as is lying opposite to the deposition unit, and a withdrawn position which is circumferentially away from the deposition unit.

According to this invention, an arrangement has been made that the second partition walls are provided so as to cover the outer cylinder parts of the can-roller, and that the conductance between the deposition chamber and the adjacent chamber is determined by the second partition walls. Therefore, for example, by appropriately setting the circumferential length of the second partition walls such that the conductance value at the first clearance becomes a predetermined value, based on a pressure difference, empirically obtained in advance, between the pressure in the adjacent chamber and the pressure in the deposition chamber, and/or based on the size of the first gap that is inevitable for the sheet-like base material to pass therethrough as a consequence of the rotation of the can-roller, it becomes possible to surely separate the atmosphere between the deposition chamber and the adjacent chamber.

Further, according to this invention, preferably the deposition unit comprises: a container box for containing therein a deposition material, and a heating means which enables the deposition material to be heated, wherein a lid body, facing the can-roller, of the container box has two lateral sides equal to or longer than a generatrix length of the can-roller, and is also bent at the curvature, the lid body having formed therein a discharge opening for discharging deposition particles that have been sublimated or evaporated by the heating with the heating means; and a moving means for radially moving back and forth the deposition unit between a deposition position in which the lid body lies close to the outer peripheral surface of the can-roller at a second gap that is curved at the curvature, and a separated position in which the lid body is away from the outer peripheral surface of the can-roller. When the deposition unit is advanced into the deposition position at the withdrawn position of the second partition wall, each of the lateral sides of the lid body respectively comes into contact with, or comes close to, the first partition wall, such that the deposition space to be partitioned by the second gap comes into communication with the adjacent chamber with the first gap serving as a boundary.

According to this arrangement, in case deposition is performed on such a part of the sheet-like base material as is wound around the can-roller, while the sheet-like base material is being transported by the base material transportation means, the deposition unit is moved to the deposition position in which the lid body of the container box lies close while leaving the second clearance. Then, the deposition material is heated by the heating means. Therefore, the sublimated or evaporated deposition particles will be discharged out of the discharge opening that is formed in the lid body. At this time, the deposition space partitioned by the second gap is in communication with the adjacent chamber with the first gap serving as the boundary and, as described above, the conductance with the adjacent space has been determined by the second partition walls. Therefore, the deposition space is surely separated from the adjacent chamber in terms of atmosphere. In other words, the degree of closure of the passage from the discharge opening to the adjacent chamber through the first gap via the deposition space will be increased. As a result, even if the opening area of the discharge opening is set relatively large in order to obtain an extremely high film-forming rate, the deposition particles to be discharged out of the discharge opening come, before spreading to a wider area, to be adhered to, and deposited on, the portion of the sheet-like base material through the deposition space as the second clearance, on the one hand. On the other hand, among the deposition particles that are discharged out of the discharge opening into the second gap, those particles that failed to contribute to the deposition on the base material, come to be returned, e.g., to the container box. As a result, there will be prevented, to the best extent possible, the occurrence in that those particles that failed to contribute to the deposition on the base material wrap around to the adjacent chamber inside the main chamber, whereby a film is formed on portions (parts) other than the sheet-like base material. The above-mentioned prevention, in turn, makes it possible to save the waste of the deposition material. By the way, if the deposition chamber inclusive of the deposition space and the adjacent chamber are surely separated in terms of atmosphere, in case, e.g., pre-processing or post-processing is to be performed by making use of a predetermined gas in the adjacent chamber, on the surface of the sheet-like base material before or after film deposition, the gas in question can be prevented from flowing into the deposition chamber.

By the way, when the deposition material is heated by the heating means, there is a case in which the amount of deposition of the deposition material in the container box is not stable at the beginning. If deposition is made on the sheet-like base material in this kind of state, there will occur a trouble, e.g., in that the film thickness becomes non-uniform. According to this invention, at least one of the second partition walls is arranged to be rotatable between: a shielding position in which such a part of the can-roller as faces the discharge opening of the lid body is shielded; and a withdrawn position in which the second partition walls are circumferentially away from the deposition unit. Therefore, it is possible to move, prior to starting the deposition on the sheet-like base material, the deposition unit to the separated position so that the deposition material in the container box can be heated by the heating means. At this time, the deposition material will be sublimated or evaporated in the container box and, depending on the amount of heating by the heating means, the amount of deposition will gradually be stabilized. During the period up to the stabilization, however, part of the deposition particles that have been sublimated or evaporated in the container box will be discharged out of the discharge opening of the lid body toward the sheet-like base material. Therefore, during the period until the amount of deposition of the deposition material in the container box becomes stable, the second partition walls may be moved to the shielding position. Then, the second partition walls serve also the purpose of a shutter to prevent the vapor deposition to the part of the sheet-like base material. In this manner, by using the second partition walls which separate in terms of atmosphere the main chamber (adjacent chamber) and the deposition space for dual purpose as a shutter, not only can the number of parts be reduced, but also can the volume of the main chamber be advantageously made smaller as compared with the arrangement in which a shutter is separately provided in the main chamber. By the way, in case the second partition walls are used as the shutter, if the deposition particles get adhered thereto, the second partition walls will be heated by the latent heat of solidification. By the radiant heat from this heated shutter the can-roller and the base material that has been wound therearound are heated, thereby resulting in a possibility of damages thereto. As a solution, preferably it is so arranged that the second partition walls have formed therein, e.g., a coolant circulation passage for circulating a coolant therethrough and that, after having moved the second partition walls to the shielding position, the second partition walls can be cooled.

Further, according to this invention, a partition plate shall preferably be disposed on both circumferential ends of the second partition walls, respectively, the partition plate having a length equivalent to, or larger than, the generatrix length of the can-roller. When the second partition walls are moved to the shielding position or the withdrawn position, any one of the partition plates and a stationary partition wall that is fixed to the main chamber and having the length equivalent to the said partition plate is arranged to come into contact with or come closer to each other, thereby constituting the first partition wall. Then, the number of parts can still further be reduced.

MODES FOR CARRYING OUT THE INVENTION

With reference to the accompanying drawings a description will now be made of an embodiment of a vacuum deposition apparatus of this invention by citing an example in which two deposition units are disposed around a can-roller so as to deposit (form a film) on a sheet-like base material Sw. In the following, the description is made on the presumption: that the can-roller is contained inside a main chamber in a posture in which an axial direction of the can-roller coincides with a horizontal direction; that the axial direction is defined as an X-axis direction; that the direction crossing at right angles to the X-axis on the same horizontal plane is defined as a Y-axis direction; and that a vertical direction crossing at right angles to the X-axis and the Y-axis is defined as a Z-axis direction. Further, the direction of "up" and "down" is based on FIG. 1.

Figure 1:
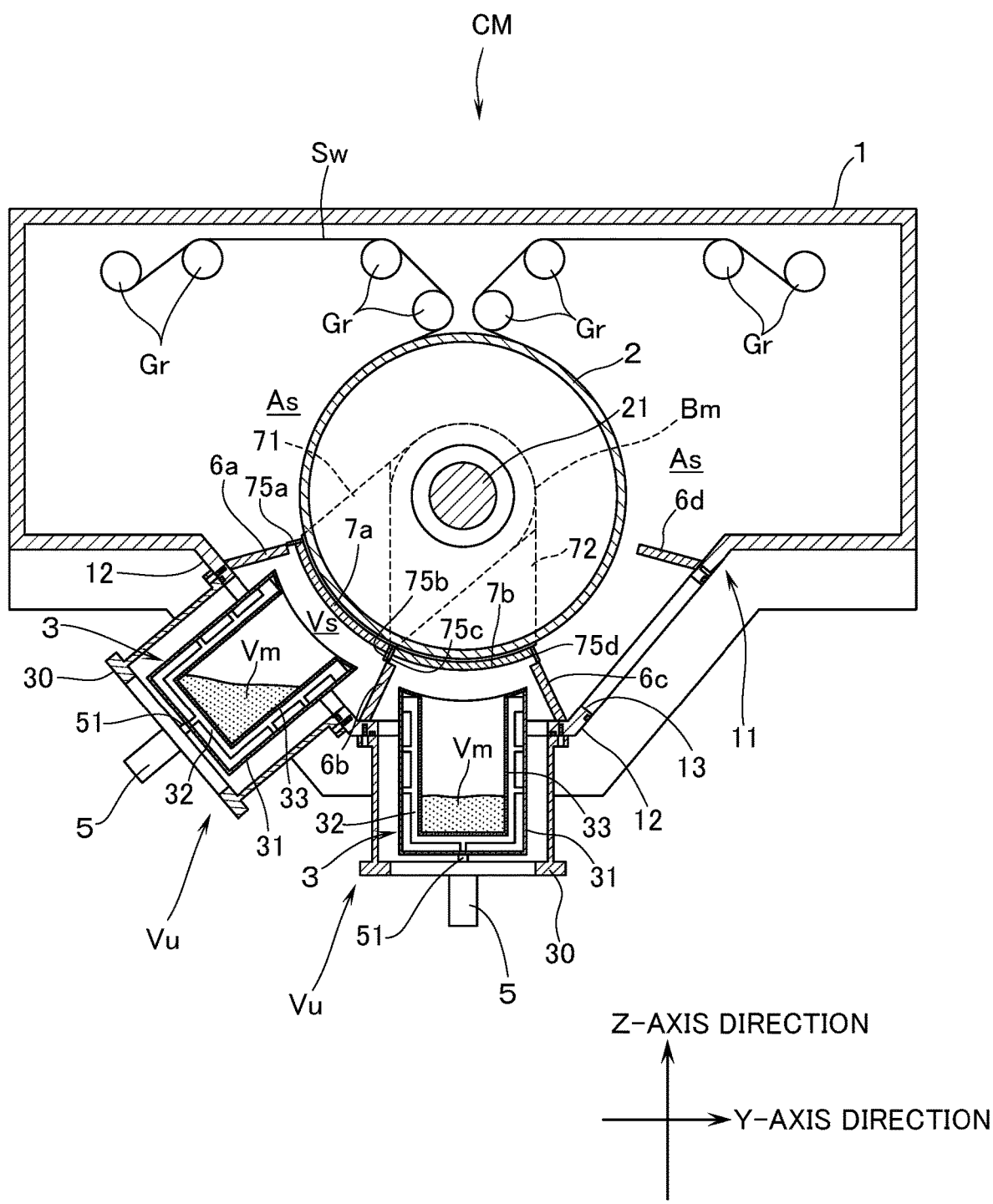
FIG. 1 is a sectional view schematically showing a vacuum deposition apparatus, in a separated position of the deposition unit, according to an embodiment of this invention.
Figure 2:
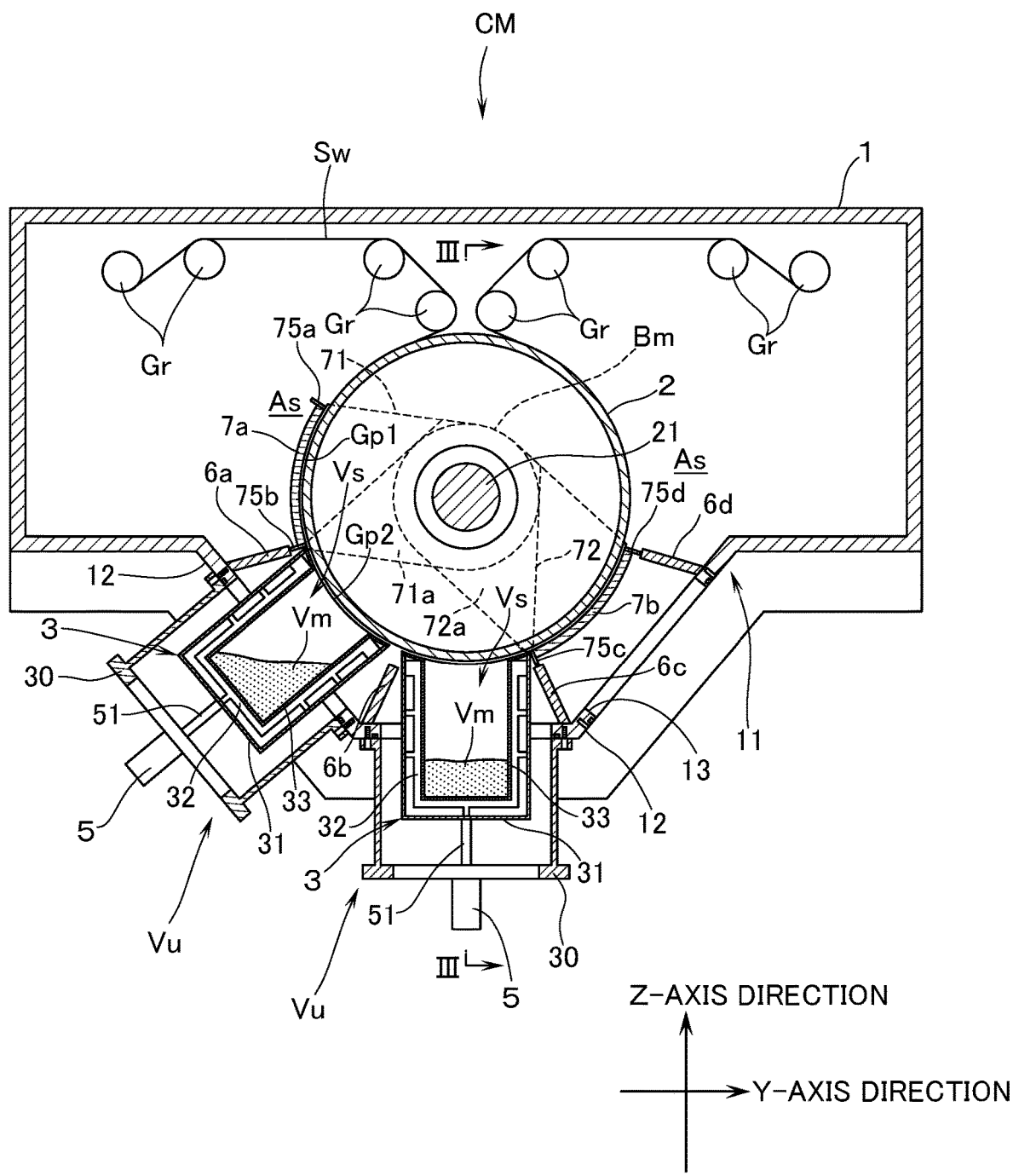
FIG. 2 is a sectional view schematically showing the vacuum deposition apparatus, in a deposition position of the deposition unit, according to an embodiment of this invention.
Figure 3:
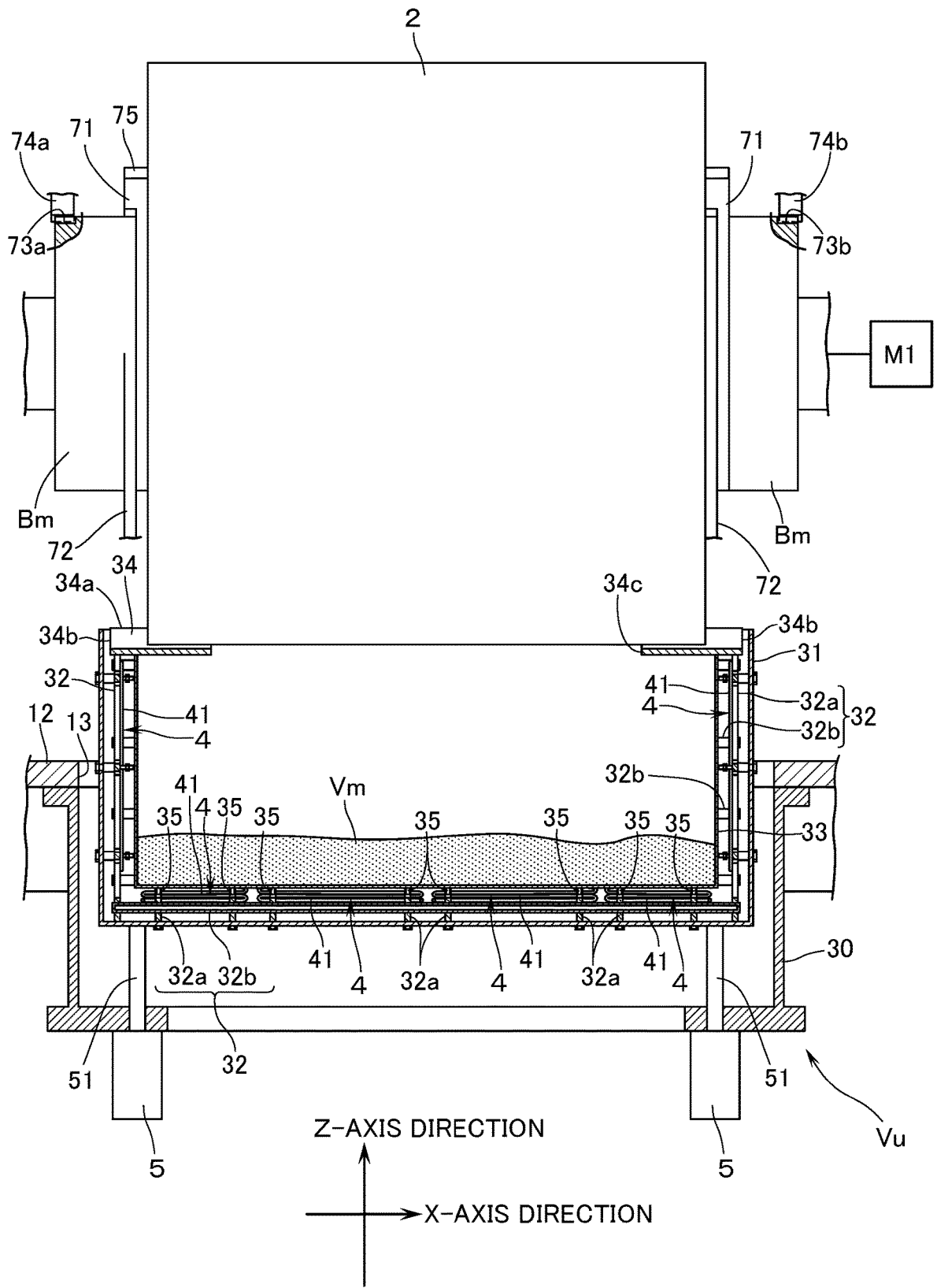
FIG. 3 is a partial sectional view taken along the line III-III in FIG. 2.

With reference to FIG. 1 to FIG. 3, the vacuum deposition apparatus CM according to this embodiment is provided with a main chamber 1. The main chamber 1 has connected thereto a vacuum pump which is made up of a turbo-molecular pump, rotary pump, and the like (not illustrated) so as to enable to form a vacuum atmosphere (e. g., $10^{-5}$ Pa). In the lower center of the main chamber 1, there is formed a projected part 11 which projects downward and has a profile of semi-true hexagon as seen in cross-section as shown in FIG. 1. In each of flat planes 12 of the projected part 11 that is elongated in the X-axis direction, there is formed a mounting opening 13 facing the can-roller 2 which will be described hereinafter. It is thus so arranged that the deposition unit Vu, to be described hereinafter, can be detachably mounted through the mounting opening 13.

In an upper space of the main chamber 1 there are disposed a plurality of guide rollers Gr as constituting elements of a base material transportation means of this embodiment, the guide rollers serving: to guide the sheet-like base material Sw to be transferred from feed rollers (not illustrated) to the can-roller 2; and to transfer the sheet-like base material Sw, that has gone around the can-roller 2, to a take-up roller (not illustrated). Although not explained by illustration, the main chamber 1 has disposed therein an upstream-side chamber and a downstream-side chamber in a side-by-side relationship with each other. The upstream-side chamber is provided with such a feed roller of the base material transportation means as feeds the sheet-like base material Sw at a constant speed. The downstream-side chamber is provided with such a take-up roller of the base material transportation means as takes up the sheet-like base material Sw that has been formed with a film, as a result of the sheet-like base material's going around the can-roller 2 in the main chamber 1. Since known art may be used as the mechanisms from feeding the sheet-like base material Sw down to taking it up, further detailed explanations will be omitted.

The can-roller 2 is so arranged: that it is provided with a rotary shaft 21; that the rotary shaft 21 is rotatably supported inside the main chamber 1 by two bearing devices Bm that are disposed in the X-axis direction (axial direction) at a distance from each other; and that the can-roller 2 can be driven for rotation at a given rotational speed by a motor M1 disposed outside the main chamber 1. Although not particularly illustrated in detail, each of the bearing devices Bm is of a type in which an inside bearing on the radially inside and an outside bearing on the radially outside are integrally assembled together to the frame body. The bearing devices Bm are thus so arranged that the inside bearing rotatably supports the rotary shaft 21 and also that the outside bearing rotatably supports a rotary arm of the second partition walls which are described hereinafter. By the way, it may be so arranged that the can-roller 2 contains therein a mechanism for heating or cooling the sheet-like base material Sw in a known manner.

Each of the deposition units Vu has the same construction with each other and is provided with a storing chamber 30 that is respectively installed on the flat plane 12 of the main chamber 1, from the outside thereof, in a manner to enclose the mounting opening 13. In this embodiment, a description will be made of an example in which two sets of the deposition units Vu are respectively mounted on one of the flat plane 12 (center in FIG. 1) positioned in a vertical direction and on the other of the flat plane 12 (left side in FIG. 1) that is inclined relative to the horizontal plane. However, this invention shall not be limited to the above-mentioned arrangement, but it is also possible, for example, to mount a deposition unit Vu on all of the flat planes 12, or to mount the deposition unit Vu only on the flat plane 12 that is positioned in the vertical direction. In this case, in the mounting opening 13 that is free from mounting therein of the deposition unit Vu, there will be mounted a lid body (in FIG. 1 and FIG. 2 lid bodies have been omitted) in order to plug the opening in question. A description will now be made of an example in which the deposition unit Vu is mounted on the flat plane 12 that is positioned in the vertical direction. The storing chamber 30 is provided with a container box 3 for containing therein the deposition material Vm, and a heating means 4 integrally assembled into the container box 3 so as to heat the deposition material Vm. As to the deposition material Vm, a metallic material or an organic material is used depending on a thin film to be formed on the sheet-like base material Sw.

Figure 4:
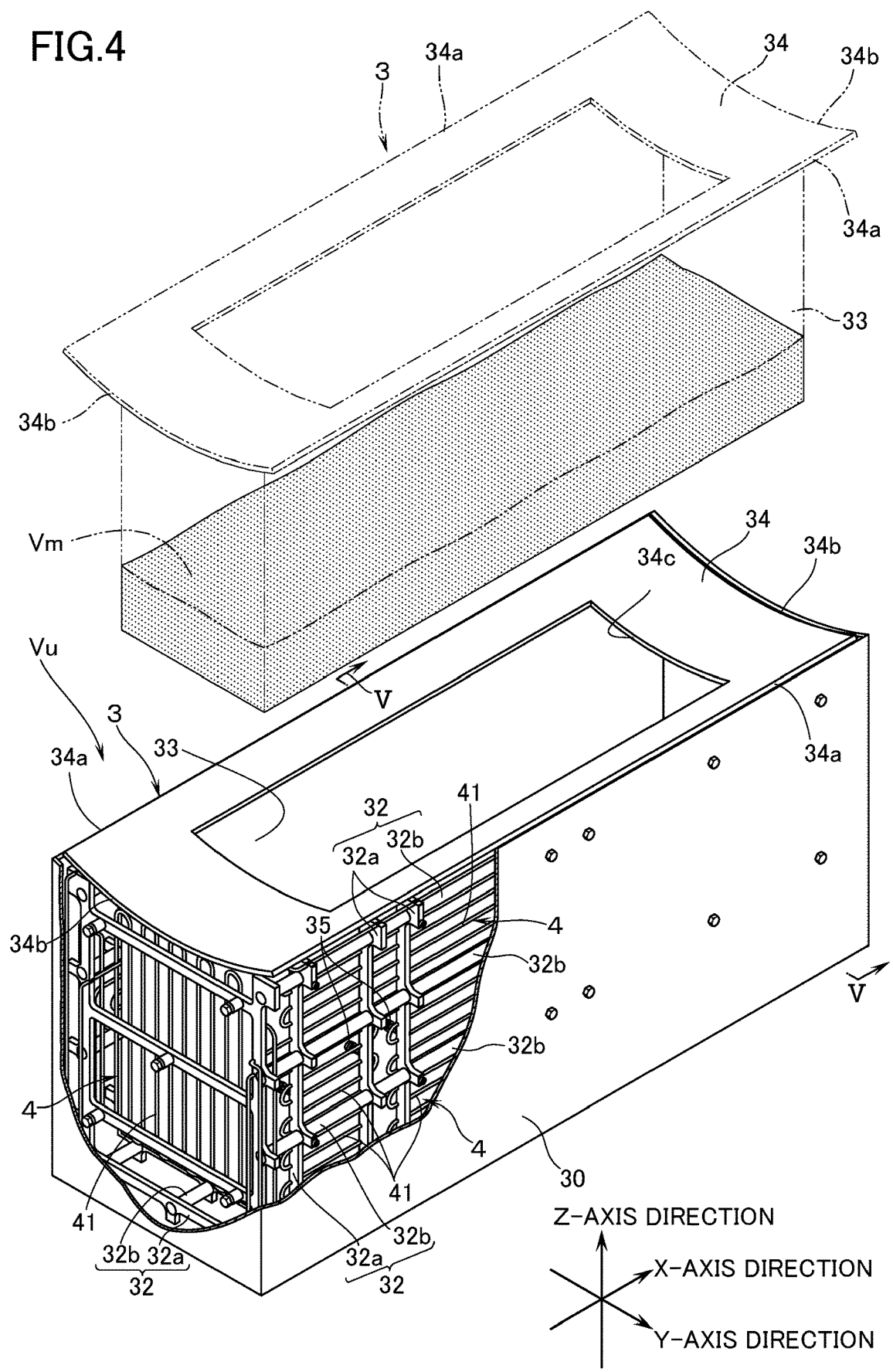
FIG. 4 is a perspective view showing a container box of the deposition unit having integrally assembled therewith a heating means.
Figure 5:
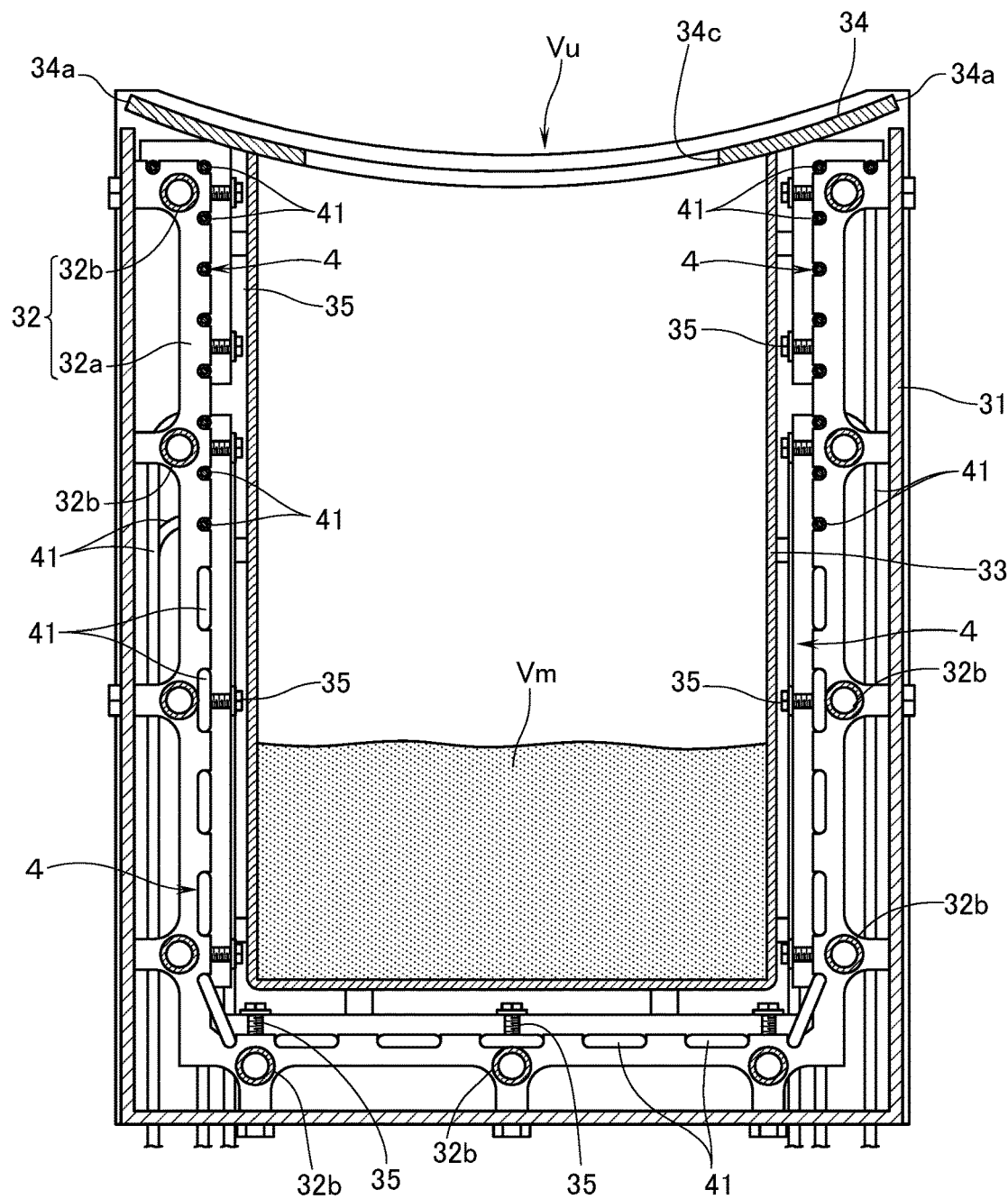
FIG. 5 is a sectional view taken along the line V-V in FIG. 4.

With reference also to FIG. 4 and FIG. 5, the container box 3 is made, e.g., of stainless steel and is constituted by: an outer vessel 31 with the upper surface (the surface to face the can-roller 2) being left open; a supporting frame 32 which is fixed to the outer vessel 31 made by assembling plate-like members 32a, 32b into a lattice shape in a manner to cover an inner wall surface of the outer vessel 31 except for the upper surface; an inner vessel 33 which is disposed on the inside of the supporting frame 32 so as to contain therein deposition material Vm; and a lid boby 34 which covers the openings in the upper surfaces of the outer vessel 31 and of the inner vessel 33. The outer vessel 31 and the inner vessel 33 have an outline of bottomed rectangular parallelepipeds that are similar to each other as seen in sectional view in FIG. 1, and the lengths in the X-axis direction of the outer vessel 31 and the inner vessel 33 are set equal to, or above, the generatrix length (length in the X-axis direction) (see FIG. 3) of the can-roller 2. The lengths (width) in the Y-axis direction of the outer vessel 31 and the inner vessel 33 are set appropriately taking into consideration the lateral width (specifically, the range of deposition in the X-axis direction relative to the base material Sw) of the sheet-like base material Sw, deposition rate, and the like.

In addition, in predetermined positions of the supporting frame 32 there are disposed a plurality of bolts 35, as supporting pins, which protrude toward the inside the supporting frame 32. It is thus so arranged that, when the inner vessel 33 is inserted into the inside of the outer vessel 31, the inner vessel 33 can be supported only by the head portion of each of the bolts 35. The lid body 34 that lies opposite to the outer peripheral surface of the can-roller 2 is constituted by bending a plate body made up of two sets of lateral sides 34a and longitudinal sides 34b, respectively elongated in parallel with each other, with a curvature that matches the curvature of the outer peripheral surface of the can-roller 2. In the center of the lid body 34 there is opened a single discharge opening 34c that coincides with the opening in the upper surface of the inner vessel 33. The inner edge of the discharge opening 34c is fixed to an upper end of the inner vessel 33 so that the inner vessel 33 and the lid body 34 are integrated. Then, when the inner vessel 33 with which the lid body 34 is integrated as shown in imaginary lines in FIG. 4 is inserted into the outer vessel 31 from the upper surface opening side, the opening on the upper surface of the outer vessel 31 will be closed by the lid body 34.

The heating means 4 is constituted by a plurality of seathed heaters 41. Each of the seathed heaters 41 is fixed to the supporting frame 32 and is arranged to be energized by a power unit (not illustrated). In case deposition is made while cooling the sheet-like base material Sw by a cooling mechanism that is housed in the can-roller 2, there is a possibility that the inner vessel 33 may give rise to a temperature gradient in the vertical direction due to the fact that the lid body 34 is cooled by radiation cooling. Therefore, the route of energizing each of the seath heaters 41 may be arranged to be divided into a plurality of vertical blocks of the inner vessel 33 so that the electric current to be energized may be varied from block to block. Then, in case the inner vessel 33 having contained therein the deposition material Vm is heated in the vacuum atmosphere by each of the sheath heaters 41 of the heating means 4 in a state in which the inner vessel 33 is kept inserted into the outer vessel 31, the deposition material Vm will be sublimated or evaporated inside the inner vessel 33, and the sublimated or evaporated deposition particles will be discharged out of the discharge opening 34c.

As described above, by employing the arrangement in which the inner vessel 33 is supported by the head portions of each of the bolts 35, thermal loss due to heat transmission becomes small, so that the inner vessel 33 can be efficiently heated. In this case, by applying mirror finish by, e.g., electrolytic polishing to the inner surface of the outer vessel 31, when the inner vessel 33 is heated by each of the sheath heaters 41, the inner surface of the outer vessel 31 serves the function of a reflector that reflects the heat. In this manner, by the addition of radiant heat, the inner vessel 33 can still more efficiently be heated. The filling factor of the deposition material Vm into the inner vessel 33 of the container box 3 is appropriately set within a range of 20% to 40% taking into consideration, e.g., the kind of the deposition material Vm, or the variation in the deposition rate accompanied by the fluctuation in the internal pressure in the inner vessel 33 during the time until the entire sublimation or evaporation of the deposition material Vm filled into the container box 3.

On an outer wall surface of the storing chamber 30, an air cylinder 5 as the moving means is provided and such a driving shaft 51 of the air cylinder 5 as extends through the outer wall surface into the inside of the storing chamber is connected to the container box 3. By means of the air cylinder 5, the container box 3 of the deposition unit Vu is free to move between: a separated position, as shown in FIG. 1, in which the lid body 34 is away from the outer peripheral surface of the can-roller 2; and a deposition position, as shown in FIG. 2, in which the lid body 34 is close to the outer peripheral surface of the can-roller 2 while leaving a gap (this gap is defined as "a second gap Gp2") that is curved at the above-mentioned curvature. This second gap Gp2 becomes a deposition space that is partitioned by the lid body 34 and such a portion of the can-roller 2 as lies opposite to the lid body. Inside the main chamber 1, in a manner positioned around the can-roller 2, there are respectively provided such stationary partition walls 6a, 6b, 6c, 6d as are fixed to the inner wall of the main chamber 1 and as are elongated in the X-axis direction. By means of the stationary partition walls 6a, 6b, 6c, 6d there are respectively defined, inside the main chamber 1, deposition chambers Vs in communication with the storing chamber 30 and having contained therein the deposition unit Vu are respectively partitioned. In this case, although not explained by particularly illustrating, it is preferable to arrange that the deposition chamber Vs is arranged to be capable of being evacuated independent of the main chamber 1. Inside the main chamber 1 there are respectively further provided second partition walls 7a, 7b (see FIG. 2) which cover the outer cylinder part at the above-mentioned curvature through a clearance (hereinafter, this clearance is defined as "a first gap Gp1") that is bent at the above-mentioned curvature along the outer cylinder part of the can-roller 2. The deposition chamber Vs and the adjacent chamber As (e.g., transfer space for the sheet-like base material Sw) inside the main chamber 1 are brought into communication with each other with the first gap Gp1 serving as a boundary. It is thus so arranged that the conductance value between the deposition chamber Vs and the adjacent chamber As can be determined by the second partition walls 7a, 7b.

Figure 6:
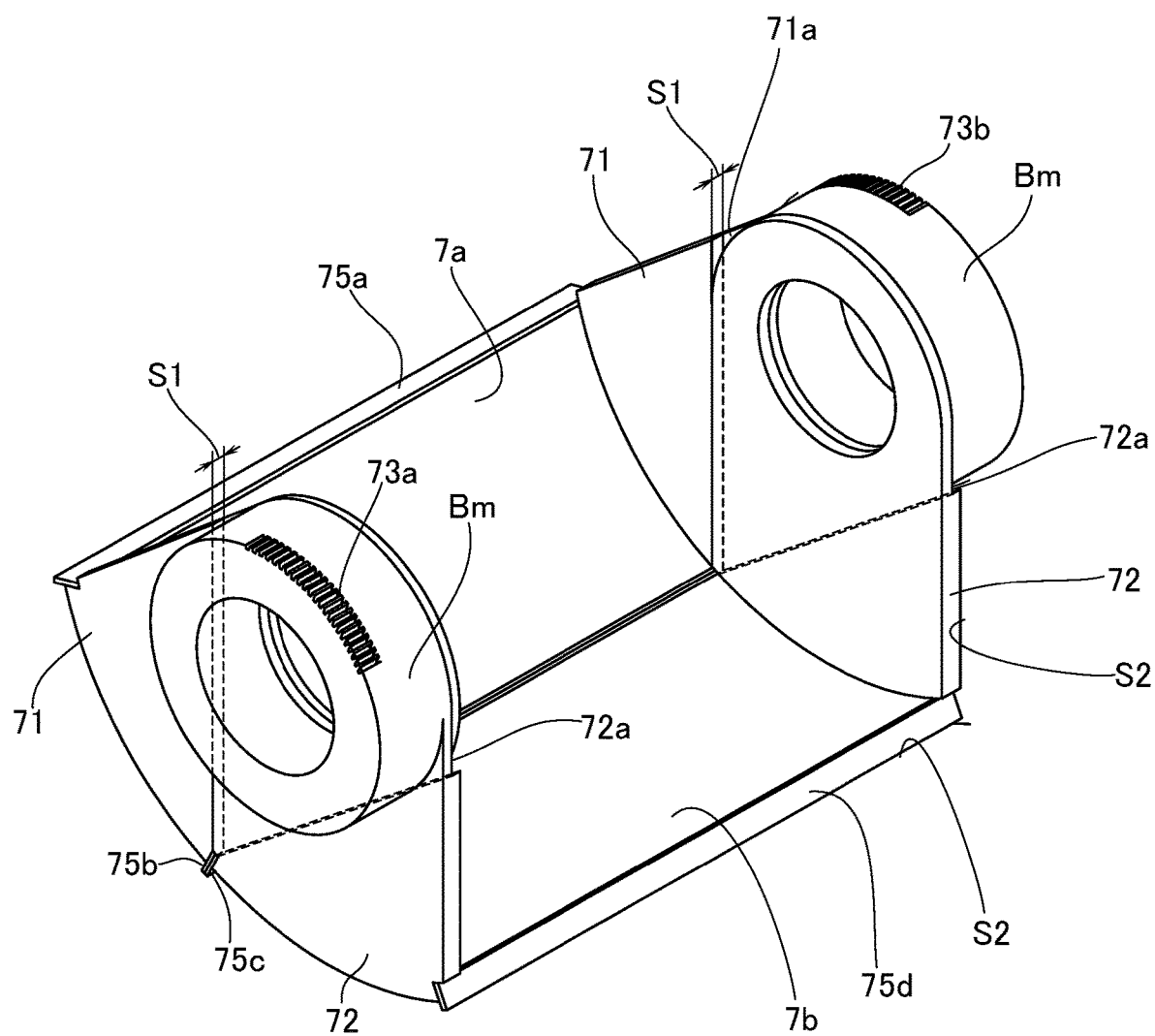
FIG. 6 is a partially exploded perspective view showing the mechanism of moving the second partition walls in a shielding position.
Figure 7:
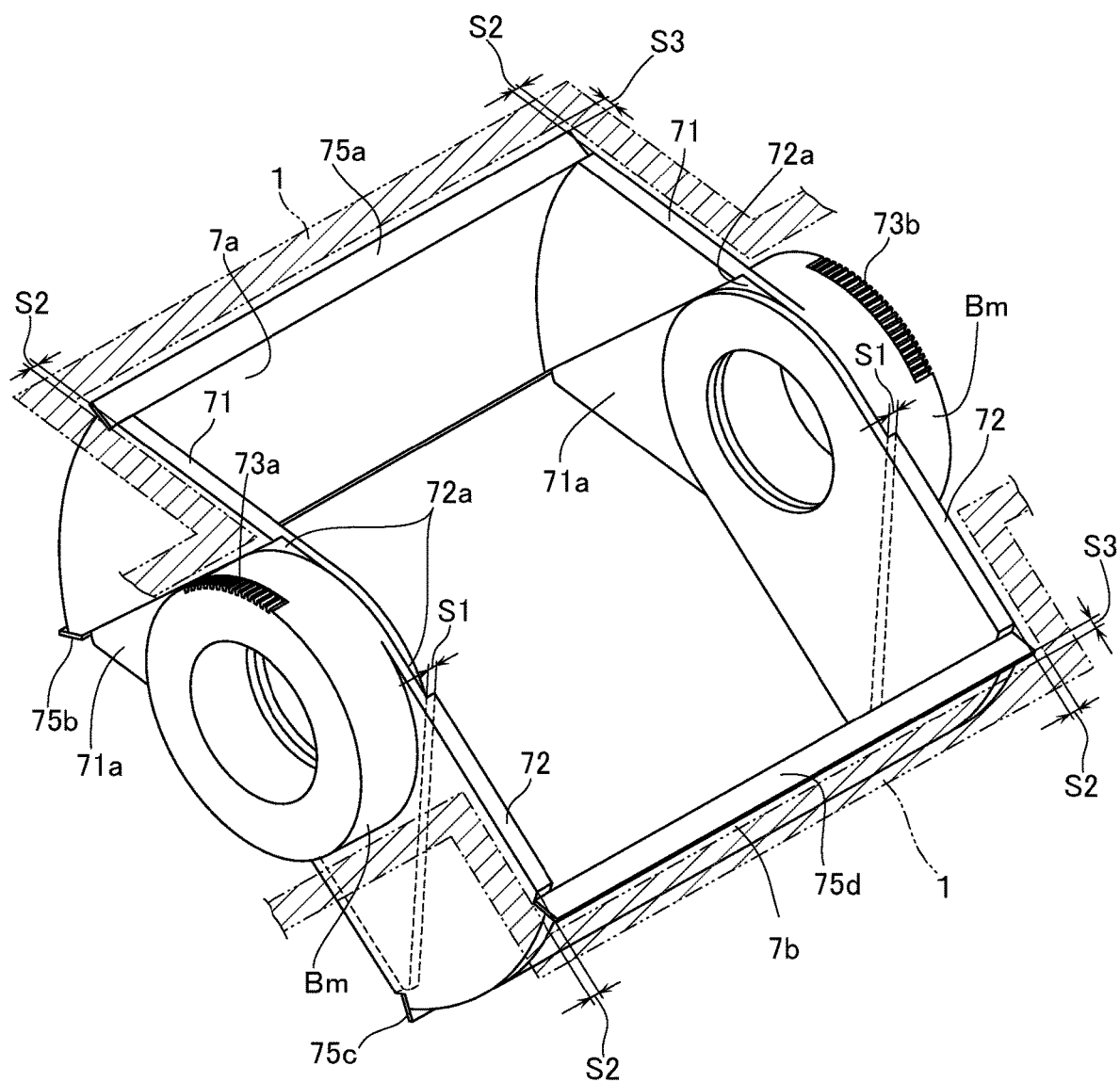
FIG. 7 is a partially exploded perspective view showing the mechanism of moving the second partition walls in the withdrawn position.

With reference also to FIG. 6 and FIG. 7, the second partition walls 7a, 7b are constituted by bending, e.g., stainless steel plate members at the above-mentioned curvature and are respectively installed between a front end of each of rotary arms 71, 72 rotatably supported by outer bearing (not illustrated) of each of the bearing devices Bm that are disposed at a distance from each other in the X-axis direction. In the outer peripheral surface of each of the bearing devices Bm, there is respectively formed set of teeth 73a, 73b at a given pitch. Each set of teeth 73a, 73b is in mesh with a rack 74a, 74b that is respectively driven by a motor (not illustrated). When the racks 74a, 74b are moved by the motor (not illustrated) in the Y-axis direction, the second partition walls 7a, 7b rotate along the outer peripheral surface of the can-roller 2 in the directions that are opposite to each other. In this case, such surfaces of respective rotary arms 71, 72 as face each other are subjected to counter boring. By overlapping the counterbored surfaces 71a, 71b while leaving the first space part S1 therebetween, both the second partition walls 7a, 7b are arranged to be respectively moveable while maintaining the first gap part Gp1 in the periphery of the can-roller 2. According to this arrangement, the second partition walls 7a, 7b become rotatable, with the rotary shaft 21 of the can-roller 2 serving as the center of rotation, between: a shielding position in which such a portion of the can-roller 2 as faces the discharge opening 34c of the lid body 34; and a withdrawn position in which the second partition walls 7a, 7b are circumferentially away from the deposition units Vu. In this case, in the route of rotation of the second partition walls 7a, 7b inclusive of the shielding position and the withdrawn position of the second partition walls 7a, 7b, the inner wall surface of the main chamber 1 is formed such that: there will be formed a second space part S2 between the end surface in the X-axis direction (axial direction) of each of the second partition walls 7a, 7b and such inner wall surface of the main chamber 1 as lies opposite to the end surface; and that a third space part S3 is formed between the outer peripheral surface of each of the second partition walls 7a, 7b and the inner wall surface of the main chamber 1.

When the deposition unit Vu is in the separate position and the second partition walls 7a, 7b are in the shielding position, respectively, as shown in FIG. 1, the deposition chamber Vs and the adjacent chamber As are in communication with each other only through the first space part S1 through the third space part S3 (see FIG. 7). However, the deposition chamber Vs and the adjacent chamber As can surely be separated in terms of atmosphere by appropriately setting, e.g., the area of the counter-bored surfaces 71a, 71b so that the conductance value in the first space part S1 attains a predetermined value due to: the size of such second space part S2 and the third space part S3 as are unavoidable from the viewpoint of the constitution of the apparatus; and the pressure difference between such a pressure in the adjacent chamber As and the pressure in the deposition chamber Vs as can be empirically obtained in advance. On the other hand, in a state in which the second partition walls 7a, 7b are moved to the withdrawn position as shown in FIG. 2 from the state as shown in FIG. 1, the deposition chamber Vs and the adjacent chamber As are in communication with each other through the second gap Gp2 in addition to the first space part S1 to the third space part S3. However, in the same manner as above, due to: the pressure difference between the pressure in the adjacent chamber As and the pressure in the deposition chamber Vs; and the size of such first gap Gp1 as is unavoidable for the sheet-like base material Sw to pass therethrough as a result of the rotation of the can-roller 2, the deposition chamber Vs and the adjacent chamber As can surely be separated in terms of atmosphere if the circumferential length of the second partition walls 7a, 7b is appropriately set so that the conductance value in the first gap Gp1 attains a predetermined value. Then, even if the deposition units Vu have been moved to the deposition position, and the second partition walls 7a, 7b have been moved to the withdrawn positions, respectively, as shown in FIG. 2, the second gap Gp2 as the deposition space can maintain the state in which the atmosphere is separated from that in the adjacent chamber As. Although not explained by particularly illustrating, it may be so arranged: that a coolant circulation passage for circulating therein a coolant is formed in the second partition walls 7a, 7b; and that, after having moved the second partition walls 7a, 7b to the shielding position, the coolant is circulated in the circulation passage through the bearing device Bm so as to cool the second partition walls 7a, 7b to a predetermined temperature.

Further, at an end surface in the circumferential direction of each of the second partition walls 7a, 7b, there is respectively mounted a partition wall plate 75a, 75b, 75c, 75d having a length equivalent to or above the generatrix length of the can-roller 2. In the shielding position of the second partition walls 7a, 7b as shown in FIG. 1, each of the partition wall plates 75a, 75b, 75c, 75d comes into contact with the radially inner end surface of the stationary partition walls 6a, 6b, 6c, respectively. On the other hand, in the withdrawn position of the second partition walls 7a, 7b as shown in FIG. 2 in which the second partition walls 7a, 7b are rotated in the direction away from each other, the partition wall plate 75b of one 7a of the second partition walls comes into contact with the stationary partition wall 6a, and the partition wall plate 75c of the other 7b of the second partition walls comes into contact with the stationary partition wall 6c, respectively. And in the withdrawn position of the second partition walls 7a, 7b the container box 3 of the deposition unit Vu is proceeded into the deposition position. Then, each of the lateral sides 34a, 34a of the lid body 34 thus comes into contact with each of the respective partition wall plates 75a, 75d of each of the second partition walls 7a, 7b so that the first gap Gp1 and the second gap Gp2 come to be communicated with each other around the periphery of the can-roller 2 (see FIG. 2). In this case, each of the partition wall plates 75a, 75b, 75c, 75d and the stationary partition walls 6a, 6b, 6c constitute the first partition wall according to this embodiment.

In case deposition is performed on such a part of the sheet-like base material Sw as is wound around the can-roller 2 while the sheet-like base material Sw is being transported by the base material transportation means in the above-mentioned vacuum deposition apparatus CM, first, the container box 3 of the deposition unit Vu is moved to the separated position, and each of the second partition walls 7a, 7b is moved to the shielding position, respectively. In this state the deposition material Vm is heated by the heating means 4. Then, the deposition material Vm inside the container box 3 will be sublimated or evaporated. The amount of deposition will become gradually stabilized depending on the amount of heating by the heating means 4. By that time, part of the deposition particles that have been sublimated or evaporated inside the container box 3 will be discharged toward the sheet-like base material Sw out of the discharge opening 34c of the lid body 34, thereby getting adhered to the second partition walls 7a, 7b, respectively. Then, once the amount of deposition of the deposition material Vm inside the container box 3 has been stabilized, each of the second partition walls 7a, 7b is respectively moved to the withdrawn position and, thereafter, the container box 3 of the deposition unit Vu is moved to the deposition position. According to this arrangement, the deposition space is formed inside the main chamber 1. When the sheet-like base material Sw is transported by the base material transportation means, deposition particles to be discharged out of the discharge opening 34c will be adhered to, and deposited on, such a portion of the sheet-like base material Sw as is wound around the can-roller 2, thereby getting deposited in a continuous manner.

According to this embodiment, the deposition chamber Vs and the adjacent chamber As can constantly be separated surely in terms of atmosphere. Then, as shown in FIG. 2, when the deposition unit Vu is in the deposition position, and the second partition walls 7a, 7b are in the withdrawn position, the sealing degree is increased in the passage from the discharge opening 34c to the adjacent chamber As through the first gap Gp1 via the second gap Gp2 as the deposition space. As a result, even if the area of the opening of the discharge opening 34c is set relatively large in order to obtain an extremely high film forming rate, the deposition particles to be discharged out of the discharge opening 34c come to be adhered to, and deposited on, a portion of the sheet-like base material Sw via the second gap Gp2 before spreading to a wide range. On the other hand, out of the deposition particles that were discharged out of the discharge opening 34c to the second gap Gp2, those failing to contribute to the deposition on the base material Sw come to be returned to the inner vessel 33. According to this arrangement, the deposition particles that wrap around to the main chamber 1 inclusive of the adjacent chamber As so as to get adhered to the portion (part) other than the sheet-like base material Sw can be restrained to the maximum extent possible and, as a result, waste of the deposition material Vm can be prevented. By the way, the deposition chamber Vs inclusive of the deposition space is separated in terms of atmosphere from the adjacent chamber As. Therefore, in case pre-processing or post-processing is performed to the surface of the sheet-like base material Sw before or after film formation in the adjacent chamber As, e.g., by using a predetermined gas, the above-mentioned gas can also be prevented from entering the deposition chamber Vs. In addition, the second partition walls 7a, 7b also serve the function of a shutter to prevent the deposition on such a part of the sheet-like base material Sw. In this manner, by causing the second partition walls 7a, 7b which separate the atmosphere of the adjacent chamber As inside the main chamber 1 and the deposition chamber Vs, to serve the dual function also of a shutter, not only can the number of constituting parts be reduced, but also can the volume of the main chamber 1 be advantageously made smaller as compared with the one having a separate shutter in the main chamber 1. Still furthermore, since the first partition wall is arranged to be constituted by each of the partition wall plates 75a, 75b, 75c, 75d and the stationary partition walls 6a, 6b, 6c, the number of constituting parts can further be reduced.

Descriptions have so far been made of an embodiment of this invention, but this invention shall not be limited to the one according to the above embodiment. Various modifications are possible within a range not departing from the substance of this invention. In the above-mentioned embodiment, a description has been made of an example of an arrangement in which the deposition unit Vu is provided with a storing chamber 30 containing therein a container box 3, the deposition unit Vu being detachably mounted on the main chamber 1. This invention, however, shall not be limited to the above, but the storing chamber may be omitted so that the container box 3 may be arranged to be disposed directly inside the main chamber 1. Further, in the above-mentioned embodiment, a description was made of an example in which two pieces of partition walls 7a, 7b are rotatable along the outer peripheral surface of the can-roller 2. However, this invention shall not be limited to the above but, in case the main chamber 1 is provided with a container box 3 in a single piece of deposition unit Vu, it is possible to arrange that the second partition wall positioned in one of the circumferential directions of the container box 3 in a fixed manner.

Further, in the above-mentioned embodiment, as the moving means for moving the container box 3 of the deposition unit Vu relative to the outer peripheral surface of the can-roller 2, a description was made of an example of the air cylinder 5 provided on the outer wall surface of the storing chamber 30. But this invention shall not be limited to the above, but other driving means may be used instead, such as a motor and the like. In addition, it may be so arranged that, when the container box 3 of the deposition unit Vu is moved back and forth, a known guide mechanism for guiding the movement may be provided inside the storing chamber 30.

Furthermore, in the above-mentioned embodiment, a description was made of an example in which, when the second partition walls 7a, 7b and the container box 3 are moved, each of the partition wall plates 75a, 75b, 75c, 75d comes into contact with the radially inner end surface of the stationary partition wall 6a, 6b, 6c, respectively and each of the lateral sides 34a, 34a of the lid body 34 comes into contact with each of the partition wall plates 75a, 75d, respectively, but this invention shall not, however, be limited to the above, but the elements in question may also be so arranged as to be close to each other through a clearance in the range not allowing the deposition particles discharged from the discharge opening 34c to the second gap Gp2 to leak into the main chamber 1. In this case, preferably a stopper shall be provided in order to appropriately limit the range of rotation of the second partition walls.

EXPLANATION OF MARKS

CM vacuum deposition apparatus
Gr guide roller (base material transportation means)

Sw sheet-like base material
Vu deposition unit
1 main chamber
2 can-roller
3 container box
34 lid body of container box
34a lateral side
34c discharge opening
4 heating means
5 air cylinder (moving means)
7a, 7b second partition wall
75a, 75b, 75c, 75d partition wall plate (first partition wall)
6a, 6b, 6c stationary partition wall (first partition wall)
As adjacent chamber
Gp1 first gap (vapor deposition space)
Gp2 second gap
S1 first space part
S2 second space part
S3 third space part

The invention claimed is:

1. A vacuum deposition apparatus comprising:
a main chamber having a base material transportation means for transporting a base material in a sheet shape and a can-roller around which is wound the base material to be transported by the base material transportation means, the main chamber being capable of forming a vacuum atmosphere;
a deposition unit for depositing on a part of the base material, the part being wound around the can-roller;
first partition walls forming a deposition chamber which stores the deposition unit; and
second partition walls disposed in continuation to the first partition walls so as to cover outer cylinder parts of the can-roller, the outer cylinder parts being positioned on both circumferential sides of the deposition unit while leaving a first gap that curves at a curvature coinciding with an outer peripheral surface of the can-roller,
wherein the deposition chamber and an adjacent chamber which is adjacent to the deposition chamber and which is inside the main chamber are in communication with each other through the first gap serving as a boundary such that a conductance between the deposition chamber and the adjacent chamber is determined by the second partition walls,
wherein at least one of the second partition walls is arranged to be rotatable in a manner such that a rotary shaft of the can-roller serves as a center of rotation between
a shielding position which shields a part of the can-roller, the part being lying opposite to the deposition unit, and
a withdrawn position which is circumferentially away from the deposition unit,
wherein at the withdrawn position a circumferential length of each of the second partition walls is set such that a conductance value in the first gap attains a predetermined value necessary to separate in atmosphere between the deposition chamber and the adjacent chamber, and
wherein the first gap is provided between the outer peripheral surface of the can-roller and the second partition walls.

2. The vacuum deposition apparatus according to claim 1, wherein the deposition unit comprises:
a container box for containing a deposition material, and a heating means which enables the deposition material to be heated,
wherein a lid body, facing the can-roller, of the container box has two lateral sides equal to or longer than a generatrix length of the can-roller, and is also bent at the curvature, the lid body having formed a discharge opening for discharging deposition particles that have been sublimated or evaporated by the heating with the heating means;
a moving means for moving back and forth the deposition unit, in a radial direction of the can-roller, between a deposition position in which the lid body lies close to the outer peripheral surface of the can-roller at a second gap that is curved at the curvature, and a separated position in which the lid body is away from the outer peripheral surface of the can-roller; and
wherein, when the deposition unit is advanced into the deposition position at the withdrawn position of the second partition walls, each of the lateral sides of the lid body respectively comes into contact with, or comes close to, the first partition wall, such that a deposition space to be partitioned by the second gap comes into communication with the adjacent chamber through the first gap serving as the boundary.

3. The vacuum deposition apparatus according to claim 2, wherein the first partition wall comprises:
a partition plate of a plurality of partition plates, each partition plate disposed on both circumferential ends of the second partition walls and, having a length equivalent to, or larger than, the generatrix length of the can-roller; and
stationary partition walls that are fixed to an inner wall of the main chamber having the length equivalent to the plurality of the partition plates, and that define each deposition chamber, and
wherein when the second partition walls are moved to the shielding position or the withdrawn position, the plurality of partition plates and the stationary partition walls are arranged to come into contact with or come closer to each other, thereby constituting the first partition wall.

4. The vacuum deposition apparatus according to claim 3, wherein the partition plates contact with a radially inner end surface of the stationary partition walls, the radially inner end surface facing the outer cylinder parts of the can-roller.

* * * * *